United States Patent
Lau et al.

(10) Patent No.: US 9,709,618 B2
(45) Date of Patent: Jul. 18, 2017

(54) COMPUTER COMPONENT CONNECTOR

(71) Applicant: Google Inc., Mountain View, CA (US)

(72) Inventors: Michael Chi Kin Lau, San Francisco, CA (US); Jeffrey S. Spaulding, Sunnyvale, CA (US); Jinal Dalal, Sunnyvale, CA (US)

(73) Assignee: Google Inc., Mountain View, CA (US)

( * ) Notice: Subject to any disclaimer, the term of this patent is extended or adjusted under 35 U.S.C. 154(b) by 50 days.

(21) Appl. No.: 14/950,305

(22) Filed: Nov. 24, 2015

(65) Prior Publication Data
US 2016/0077145 A1     Mar. 17, 2016

Related U.S. Application Data

(62) Division of application No. 13/838,880, filed on Mar. 15, 2013, now Pat. No. 9,225,087.
(Continued)

(51) Int. Cl.
*H01R 12/77* (2011.01)
*G01R 31/04* (2006.01)
(Continued)

(52) U.S. Cl.
CPC .......... *G01R 31/043* (2013.01); *G06F 1/187* (2013.01); *G11B 33/02* (2013.01); *G11B 33/08* (2013.01);
(Continued)

(58) Field of Classification Search
CPC ............................ H01R 12/91; H01R 2201/06
(Continued)

(56) References Cited

U.S. PATENT DOCUMENTS

| 5,187,643 A | 2/1993 | I-Shou |
| 5,229,944 A | 7/1993 | Yasuno |

(Continued)

FOREIGN PATENT DOCUMENTS

| EP | 1993173 A1 | 11/2008 |
| WO | 93/02488 | 2/1993 |

OTHER PUBLICATIONS

International Search Report and Written Opinion in International Application No. PCT/US2013/059650, dated Dec. 27, 2013, 10 pages.

(Continued)

*Primary Examiner* — Dion R Ferguson
*Assistant Examiner* — Mandeep S Buttar
(74) *Attorney, Agent, or Firm* — Fish & Richardson P.C.

(57) ABSTRACT

A computer component mounting assembly includes a carrier to support a hard drive and a data connector. The carrier is configured to slidably receive the hard drive along a first axis. The data connector includes a first connector configured to mate to pins of the hard drive, a second connector configured to mate to a SATA data connector, and a flexible cable connecting the two. The first connector includes an alignment feature to engage a corresponding alignment feature on the hard drive. The first connector is coupled to the carrier and slidable in a plane perpendicular to the first axis, and the first connector is configured such that when carrier receives the hard drive and the alignment feature engages the corresponding alignment feature the first connector moves in the plane perpendicular to the first axis to provide alignment of the first connector to the pins of the hard drive.

14 Claims, 5 Drawing Sheets

Related U.S. Application Data

(60) Provisional application No. 61/701,556, filed on Sep. 14, 2012.

(51) Int. Cl.
*H01R 12/71* (2011.01)
*G11B 33/02* (2006.01)
*G06F 1/18* (2006.01)
*G11B 33/08* (2006.01)
*H01R 12/91* (2011.01)

(52) U.S. Cl.
CPC ........... *H01R 12/716* (2013.01); *H01R 12/91* (2013.01); *H01R 12/771* (2013.01); *H01R 2201/06* (2013.01)

(58) Field of Classification Search
USPC ............ 361/679.31, 679.33, 679.35, 679.36, 361/679.39
See application file for complete search history.

(56) References Cited

U.S. PATENT DOCUMENTS

| | | | |
|---|---|---|---|
| 5,383,081 A * | 1/1995 | Nishikawa | H02H 9/004 323/908 |
| 5,798,951 A * | 8/1998 | Cho | G06F 1/24 361/679.42 |
| 5,971,797 A | 10/1999 | Straub et al. | |
| 2003/0002261 A1 | 1/2003 | Berry et al. | |
| 2003/0206397 A1 | 11/2003 | Allgeyer et al. | |
| 2005/0018397 A1 | 1/2005 | Kay et al. | |
| 2007/0128947 A1 | 6/2007 | Lin | |
| 2007/0155201 A1 | 7/2007 | Ellison et al. | |
| 2008/0113525 A1 | 5/2008 | Tzur | |
| 2009/0109329 A1 | 4/2009 | Cummings et al. | |
| 2011/0173805 A1 | 7/2011 | Richet et al. | |
| 2012/0087084 A1 | 4/2012 | Nguyen et al. | |
| 2012/0243171 A1 | 9/2012 | Spaulding et al. | |
| 2014/0078664 A1 | 3/2014 | Lau et al. | |
| 2014/0126129 A1 | 5/2014 | Kyle | |

OTHER PUBLICATIONS http://www.sciencedirect.com/science/article/pii/092442479087076U, J.F Hetke, Science Direct, Nov. 6, 2001.
International Preliminary Report on Patentability in International Application No. PCT/US2013/059650, dated Mar. 26, 2015, 7 pages.
Partial Supplementary European Search Report issued in European Application No. 13837563.9 on Apr. 26, 2016, 7 pages.
Extended European Search Report issued in European Application No. 13837563.9 on Sep. 1, 2016, 13 pages.

* cited by examiner

COMPUTER COMPONENT CONNECTOR

CROSS-REFERENCE TO RELATED APPLICATIONS

This application is a divisional of U.S. application Ser. No. 13/838,880, filed Mar. 15, 2013, which claims priority to U.S. Provisional Application Ser. No. 61/701,556, filed Sep. 14, 2012, the entire disclosures of which are incorporated by reference.

TECHNICAL FIELD

This disclosure relates to a connector for connecting computer components.

BACKGROUND

A typical computer component with moving parts, e.g., a hard disk drive, is sensitive to vibration. Accordingly, a hard disk drive is typically designed to account for vibration caused by rotation of the platter of the hard disk drive, movement of the read/write head, and the like.

However, when multiple components with moving parts are mounted on a common support structure, e.g., a motherboard or a tray in a server rack, then the vibrational energy from one component can be transmitted to another component. For example, if multiple hard disk drives are mounted on a common support structure, the vibrational energy from one hard disk drive can be transferred to another hard disk drive. One way of reducing the transmission of vibrational energy is to mount the components in a carrier that is supported by a vibration isolation system.

SUMMARY

During installation of a computer component into a mounting assembly, a cable/connector that can blind mate to the inserted computer component may be desirable. When the mounting assembly includes a vibration isolation system designed to minimize the transfer of energy to and from the computer component, it may also be desirable to have a cable/connector that has a minimal effect on the frequency response of the vibration-isolated assembly. A technique to address these needs is to provide a cable/connector that can float relative to the carrier that houses the computer component.

In one aspect, a computer component mounting assembly includes a carrier to support a hard disk drive and a data connector. The carrier includes a front face having an opening, and wherein the carrier configured to slidably receive the hard disk drive into the opening and along a first axis. The data connector includes a first connector configured to mate to pins of the hard disk drive, a second connector configured to mate to a SATA data connector, and a flexible cable connecting the first connector to the second connector. The first connector is supported on the carrier and positioned at a back side of the carrier on a side of the carrier opposite the front face, the first connector includes an alignment feature to engage a corresponding alignment feature on the hard disk drive, the first connector is coupled to the carrier and slidable in a plane perpendicular to the first axis, and the first connector is configured such that when carrier receives the hard disk drive and the alignment feature engages the corresponding alignment feature the first connector moves in the plane perpendicular to the first axis to provide alignment of the first connector to the pins of the hard disk drive.

Implementations may include one or more of the following features. The carrier may include a back plate at the back side of the carrier, the back plate parallel to the plane, and wherein the back plate extends into a guide slot in a side of the first connector such that the first connector is vertically slidable relative to the back plate. The back plate may include a notch having a top edge, a portion of the first connector projects into the notch, and the portion and the notch may be configured such that the top edge of the notch limits upward travel of the first connector. The carrier may include a bottom plate, the back plate may extend vertically from the bottom plate, and the bottom plate may limit downward travel of the first connector. The carrier may include a back plate at the back side of the carrier, the back plate may having an aperture separating the back plate into a first portion and a second portion, and the first portion of the back plate may extend into a first guide slot on a first side of the first connector and the second portion of the back plate may extend into a second guide slot on a second side of the first connector opposite the first side. A width of the aperture may be greater than a width of the first connector between the first guide slot and the second guide slot. The first portion of the back plate may include a first notch having a first top edge, and a first portion of the first connector on the first side may project into the first notch, the second portion of the back plate may include a second notch having a second top edge, and a second portion of the first connector on the second side may project into the second notch. The first portion of the first connector and the first notch may be configured such that the first top edge of the first notch limits upward travel of the first side of the first connector, and the second portion of the first connector and the second notch may be configured such that the second top edge of the second notch limits upward travel of the second side of the first connector. Each of the first portion and the second portion of the first connector may be flexible in a second axis perpendicular to the first axis. Each of the first portion of the first connector and the second portion of the first connector may include a horizontal top surface and a slanted outer surface. The first connector may have a smaller range of motion along the first axis than perpendicular to the first axis. The first connector may have a vertical range of motion of about 0.015 inches. The first connector may include a plurality of pins extending parallel to the first axis, the plurality of pins spaced apart along a second axis perpendicular to the first axis. The carrier may include a bottom plate, the back plate may extend vertically from the bottom plate, and the second axis may be parallel to the bottom plate. The flexible cable may extend upward from the first connector parallel to the plane. The flexible cable may include data cabling having a first insulative sheath and power cabling having a second separate insulative sheath spaced apart from the first insulative sheath. The second connector may include a plurality of pins extending parallel to a second axis, and the flexible cable protrudes from the second connector at an acute angle relative to the first axis.

In another aspect, a data connector includes a first connector configured to mate to pins of the hard disk drive, a second connector configured to mate to a SATA connector of a printed circuit board, the second connector including a plurality of pins extending parallel to a first axis, and a flexible cable connecting the first connector to the second connector, wherein the flexible cable protrudes from the second connector at an acute angle relative to the first axis.

Implementations may include one or more of the following features. The plurality of pins may be spaced apart along a second axis perpendicular to the first axis, and a portion of the flexible cable may include wires spaced apart along the second axis. The acute angle may be between 20° and 45°.

In another aspect, a printed circuit board assembly includes a printed circuit board and a plurality of data connectors. The printed circuit board has a plurality of SATA connectors arranged in a column along a first axis, the SATA connectors including pins spaced apart along a second axis perpendicular to the first axis, the pins extending parallel to the first axis. Each data connector includes a first connector configured to mate to pins of the hard disk drive, a second connector mated to a SATA connector of the plurality of SATA connectors, and a flexible cable connecting the first connector to the second connector, wherein the flexible cable protrudes from the second connector at an acute angle relative to the first axis.

In another aspect, a method for detecting that a hard disk drive is inserted into a carrier includes supporting a first connector of a data connector on the carrier, the first connector configured to mate to pins of the hard disk drive, applying power to a first pin of the first connector, and sensing whether a signal on second pin of the first connector shifts from low to high when power is applied to the first pin.

The details of one or more implementations are set forth in the accompanying drawings and the description below. Other aspects, features and advantages will be apparent from the description and drawings, and from the claims.

DESCRIPTION OF DRAWINGS

Like reference symbols in the various drawings indicate like elements.

DETAILED DESCRIPTION

Figure 1A:
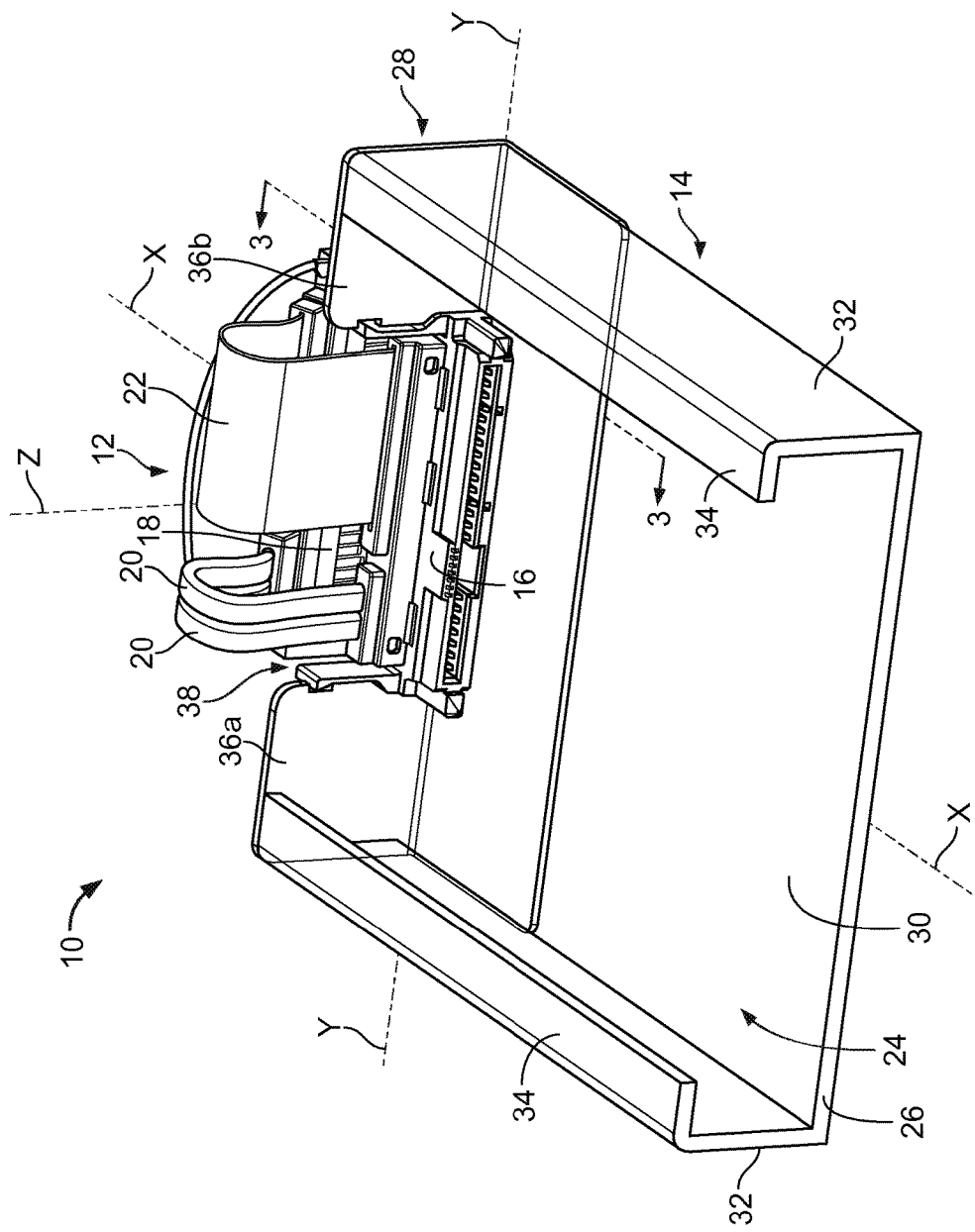
FIG. 1A is a perspective view of a computer component mounting assembly.
Figure 1B:
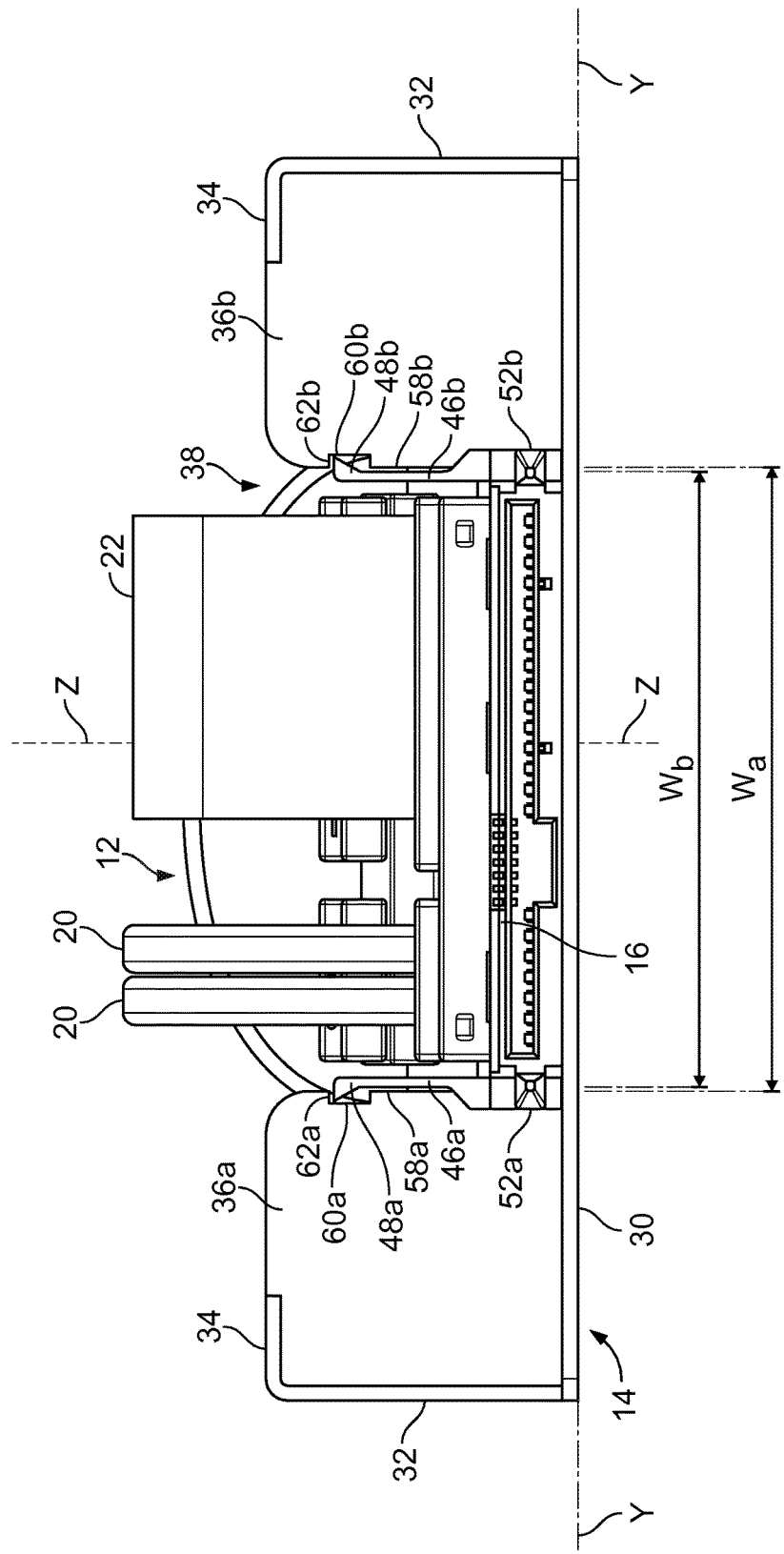
FIG. 1B is a front view of the computer component mounting assembly.

Referring to FIGS. 1A and 1B, a computer component mounting assembly 10 includes a data connector 12 and a carrier 14. The data connector 12 is configured to connect a computer component, e.g., a hard disk drive (HDD), to a controller board (FIG. 4) and includes a component side connector 16, a board side connector 18, and one or more flexible cables that connect the component side connector 16 to the board side connector 18. The one or more flexible cables can include, for example, shielded cables 20 and a flat cable 22. The carrier 14 is configured to receive the computer component, e.g., the HDD, and can be supported by a vibration isolation system, which is further described in U.S. patent application Ser. No. 13/071,406, filed Mar. 24, 2011, which is incorporated herein by reference in its entirety. As described further below, the component side connector 16 of the data connector 12 is designed and adapted to slidably couple to the carrier 14 such that, upon insertion of the computer component into the carrier 14, the component side connector 16 can move relative to the carrier 14 to allow the computer component to blind mate to the connector 16 (a blind mate connector is one in which the user cannot see or feel the connector to ensure that it is correctly aligned). In particular, when the HDD is inserted into the carrier 14, it will block the user's view of the connector 16.

The carrier 14 is configured to receive the computer component, e.g., the HDD. Specifically, the carrier 14 can be configured to slidably receive the computer component through an opening 24 in a front face 26 of the carrier 14. The computer component can then slide within the carrier 14 along an axis X and toward a back side 28. In the implementation illustrated in FIGS. 1A and 1B, the carrier 14 has a bottom plate 30, two opposing side plates 32 extending vertically from opposite sides of the bottom plate 30, and two flanges 34 extending inwardly over the bottom plate 30 from the top edges of the side plates 32. In some cases, portions of the flanges 34 can extend across the entire width of the carrier 14.

In some implementations, to secure the computer component, portions of the carrier 14 can make direct contact to opposite sides of the computer component. For example, leaf springs (not shown) can project from various locations on the carrier 14 to contact and hold, for example, the HDD that is inserted into the carrier 14. Alternatively, or additionally, the computer component can be rigidly secured within the carrier 14 via screws or the like.

The data connector 12 can provide electrical coupling between the computer component and the controller board (FIG. 4) and is configured to be supported on the carrier 14 at its back side 28. In some implementations, portions of the data connector 12 can be movably coupled to the carrier 14 such that a floating connection exists between the connector 12 and the carrier 14. For example, the component side connector 16 that is movably coupled to the carrier 14 can be slidable in a vertical plane YZ, the plane YZ being positioned at the back side 28 of the carrier 14 and oriented perpendicular to the axis X (see FIG. 1A). Additionally, flexible cabling, e.g., shielded cables 20 and the flat cable 22, that connects the component side connector 16 to the board side connector 18 can extend upward from an upper surface of the component side connector 16 in a direction generally parallel to the plane YZ.

In some implementations, the carrier 14 includes a back plate to which the component side connector 16 can mechanically couple. Additionally, as shown in FIGS. 1A and 1B, the back plate can include back plate portions 36a, and b. The back plate portions 36a, and b are oriented parallel to the plane YZ and extend vertically from the bottom plate 30. Additionally, the back plate portions 36a, and b can be spaced apart to define an aperture 38, e.g., a rectangular cutout, therebetween that is shaped and sized to receive the component side connector 16. As discussed further below, a portion of the back plate can extend into a side of the component side connector 16 such that the connector 16 can slide, for example, vertically relative to the back plate.

Figure 2A:
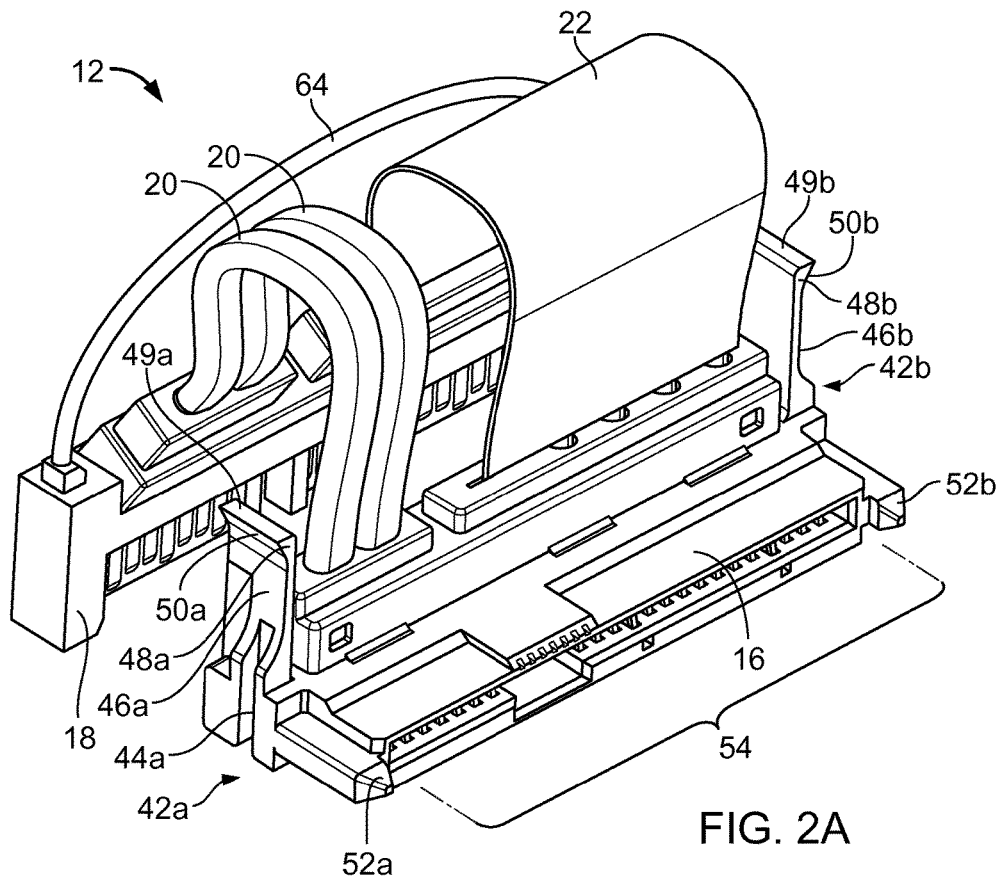
FIGS. 2A and 2B are perspectives of a data connector.

Referring to FIG. 2A, a first side 42a of the component side connector 16 includes a first guide slot 44a, a first tab 46a, and a first alignment feature 52a. Similarly, a second side 42b of the component side connector 16 includes a second guide slot 44b (FIG. 2B), a second engagement tab 46b, and a second alignment feature 52b. Each guide slot 44a, and b can be a channel or recess formed in the side surface of the component side connector 16, with the channel or recess extending parallel to an axis Z. The tabs 46a, and b are cantilever-like structures that extend vertically upward from the first and second sides 42a, and b of the connector 16, respectively, and include first and second projections 48a, and b at their respective terminal ends. The projections 48a, and b extend laterally outward from the tabs 46a, and b and include horizontal top surfaces 49a, and b. A slanted outer surface 50a, and b can flare outward from a body of the tab 46a, and b to connect to the laterally extended terminal edge of the top surface 49a, and b. To enable a ratcheting action between the component side connector 16 and the carrier 14, as described further below, the cantilevered structure of the tabs 46a, can be flexible along a general direction parallel to the axis Y.

The alignment features 52a, and b can include various structures that promote alignment relative to correspondingly shaped receiving features of the computer component. For example, the alignment features 52a, and b can be in the form of rectangular posts having pyramid-shaped tips, wherein the alignment features 52a, and b are shaped and sized to align to and fit within corresponding features in the computer component. As discussed further below, the guide slots 44a, and b and the alignment features 52a, and b are configured to cooperate with portions of the back plate and the computer component, respectively, to help align the first connector 16 to the computer component as the latter is inserted into the carrier 14.

To electrically couple the computer component to the controller board, the component side connectors 16 and board side connectors 18 include a plurality of pins 54, 56 that make contact with corresponding pins of the computer component and the controller board, respectively, to provide appropriate date and/or power connections. The pins 54, 56 can be shaped and arranged as necessary to mate with the corresponding pins of the computer component and the controller board. For example, the plurality of pins 54 of the component side connector 16 can extend in a direction parallel to axis X while being spaced apart along an axis parallel to the axis Y. The plurality of pins 56 of the board side connector 18 can extend in a direction parallel to the axis Z while being spaced apart along an axis parallel to the axis Y. In some implementations, the board side connector 18 includes a handle 64 that can be pulled to remove the connector 18 from the controller board. Alternatively, the plurality of pins 56 of the board side connector 18 can extend in a direction parallel to the axis X while being spaced apart along an axis parallel to the axis Y.

Figure 2B:
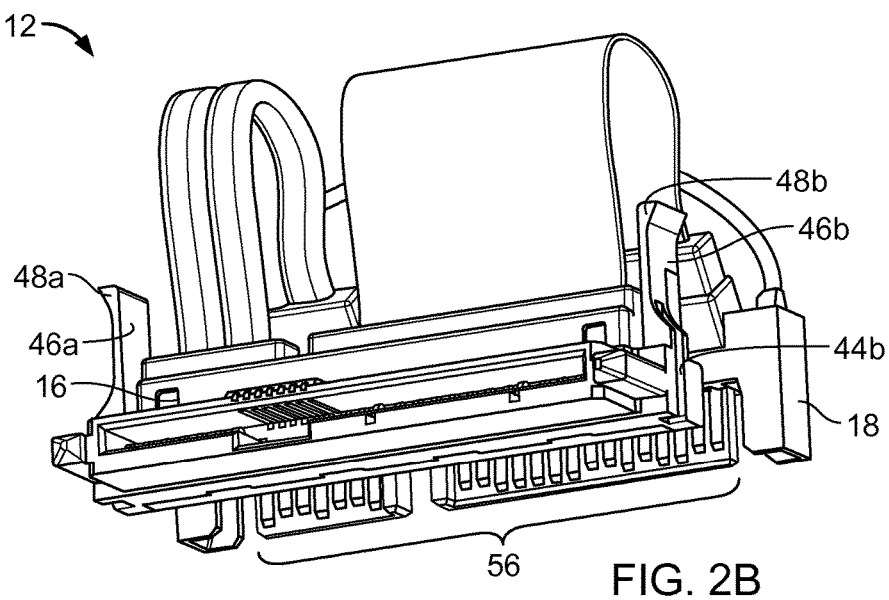

Referring again to FIGS. 1A and 1B, the component side connector 16 of the data connector 12 is configured to slidably couple to the carrier 14 and be able to move relative to the carrier 14 after coupling thereto. For example, the component side connector 16 can be inserted into the aperture 38 of the carrier 14 such that a portion of a vertical edge 58a of the back plate portion 36a extends into the guide slot 44a (FIG. 2A) and a portion of a vertical edge 58b of the back plate portion 36b extends into the guide slot 44b (FIG. 2B). Therefore, in the mounted configuration shown in FIG. 1B, the component side connector 16 can slide relative to the carrier 14 in the plane YZ along the axis Z. On the other hand, the vertical edges 58a, 58b generally prevent the connector from moving along the axis X or about the axes Y or Z.

In some implementations, the vertical edge 58a includes a notch 60a having a top edge 62a. In use, as the component side connector 16 slides into the aperture 38, the vertical edge 58a pushes the projection 48a inward, thereby flexing the tab 46a. When the projection 48a reaches the notch 60a, the projection 48a projects into the notch 60a as the tab 46a returns to its unflexed state. The component side connector 16 can continue to slide downward into the aperture 38 until its downward travel becomes limited by the bottom plate 30 of the carrier 14. Contact between the horizontal top surface 49a (FIG. 2A) of the projection 48a and the top edge 62a of the notch 60a limits an upward travel of the component side connector 16, thus discouraging the connector 16 from backing out of the aperture 38. Similarly, the vertical edge 58b can have a notch 60b with a top edge 62b.

The sliding coupling between the component side connector 16 and the carrier 14 results in a type of floating connection between the two structures. As used herein, a floating connection can refer to a coupling system in which a relative movement between the two connected structures may be limited but not completely restricted. For example, the bottom plate 30 and the top edges 62a, and b can cooperate with the component side connector 16 as described above to allow a vertical range of motion of about 0.010 to 0.020 inches in a direction generally parallel to axis Z.

The component side connector 16 of the data connector 12 can float in the opening 24 as the HDD slides in. The component side connector 16 can slide and snap into place before the HDD slides in. The component side connector 16 can also be removed by squeezing in the slanted outer surfaces 50a, and 50b. This is useful when the cable is damaged, and allows the data connector 12 to be easily removed and replaced.

In some implementations, a width, $W_a$, of the aperture 38 is greater than a width, $W_b$, between the first guide slot 44a and the second guide slot 44b. For example, the width, $W_a$, can be approximately 1.5 inches, while the width, $W_b$, can be approximately 1.49 inches. As such, the component side connector 16 can move relative to the carrier 14 in a direction generally parallel to the axis Y. Additionally, a width, of the back plate portion 36b can be less than a width of the slot 44b. This looseness can prevent binding due to the angle of each connector. This small gap permits a 0.4° angle due to tolerances at the front of the carrier. As such, the component side connector 16 can move relative to the carrier 14 in a direction generally parallel to the axis X. The relative ranges of motion along the X, Y, and Z axes, respectively, can be chosen based on various requirements of the computer component mounting assembly 10. For example, the range of motion along the axis Z can be greater than the range of motion along the axis Y. For example, the range of motion along the axis Y can be greater than the range of motion along the axis X. Additionally, depending on the relative ranges of motion along the X, Y, and/or Z axes, limited rotational freedom can result between the connector 16 and the carrier 14.

In use, when the computer component is inserted into the carrier 14, the alignment features 52a, and b of the component side connector 16 interact with corresponding features on a rear portion of the computer component, thereby causing the connector 16 to move relative to the carrier 14 as necessary to compensate for any misalignment between corresponding pins of the connector 16 and the computer component. This self-aligning interface between the component side connector 16 and the computer component allows for blind mating therebetween with greater manufacturing tolerances in the carrier 14, the data connector 12, and/or the computer component.

Figure 3:
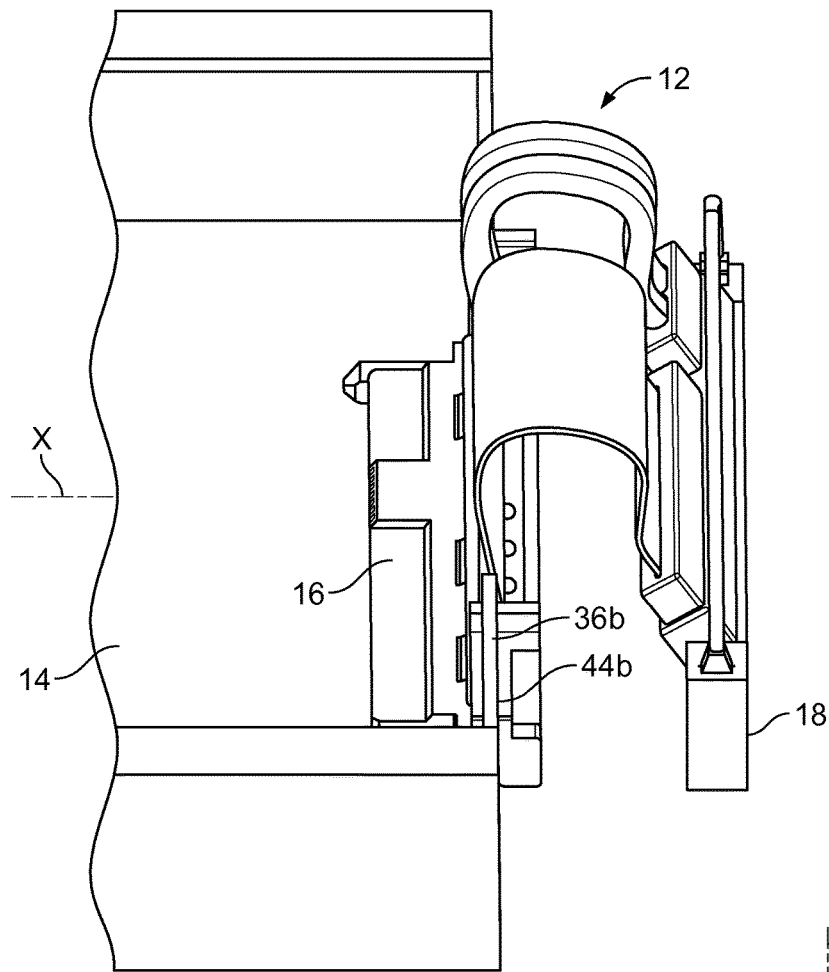
FIG. 3 is a side cross-sectional perspective view of the computer component mounting assembly.
Figure 4:
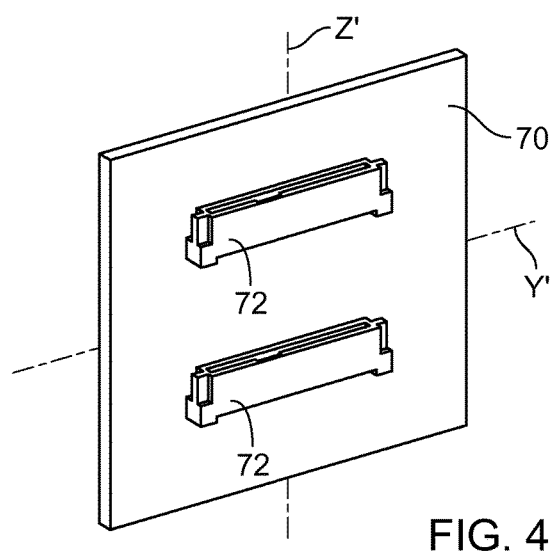
FIG. 4 is a perspective view of a controller board.

Referring to FIG. 4, a controller board 70 includes one or more connectors 72 that couple to the board side connectors 18 (FIG. 3) of the data connector 12. The controller board 70 can be a printed circuit board assembly (PCBA) that is secured vertically, for example, to a base plate of a vibration isolating component mounting assembly (not shown). In this configuration, a vertically oriented longitudinal axis Z' of the board 70 will be generally parallel to the axis Z of the carrier 14 (FIG. 1A). Additionally, each connector 72 has pins extending parallel to the axis Z' and spaced apart in a direction parallel to an axis Y' that is perpendicular to the axis Z'. In some cases, a plurality of connectors 72 can be arranged in a column along the axis Z'. In some implementations, the one or more connectors 72 can be Serial Advanced Technology Attachment (SATA) connectors.

Figure 5:
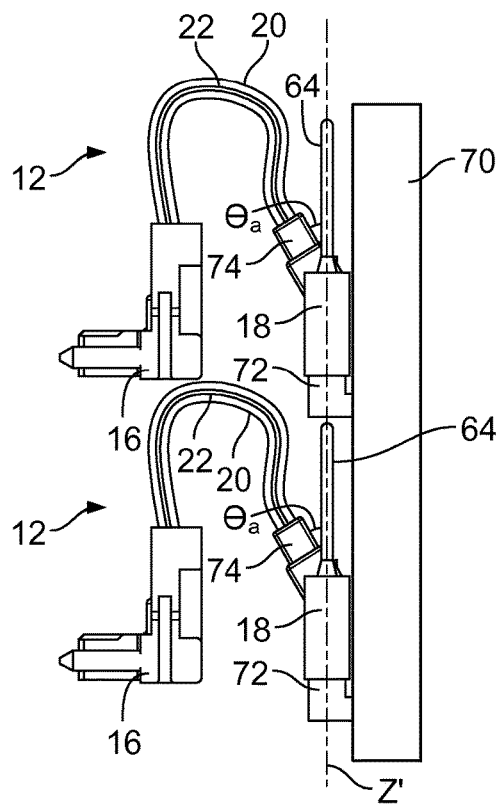
FIG. 5 is a side view of the controller board and data connectors.

Referring also to FIG. 5, the pins of the connector 72 that extend parallel to the axis Z' enable the board side connector 18 to be inserted vertically into the connector 72. As a result, the engaged connector 72 and connector 18 can be low-profile and almost flush relative to the board 70. Additionally, the upwardly protruding flexible cabling at the component side connector 16 allows the computer component to be connected to the connector 72, via the data connector 12, with minimal space therebetween.

In some implementations, the flexible cabling at the board side connector 18 protrudes from the board side connector 18 at an acute angle, $\theta_a$, relative to the axis Z'. For example, a connector coupling device 74, to which the cables 20, 22 are connected, can be pivotally mounted to the connector 18 such that the acute angle, $\theta_a$, can vary between 0 and 20°, which is selected to offset the bottom cable from the one above. If the board is further away the connector on 70 could be parallel to the axis X or the cable could have a 90° angle. In some cases, the coupling device 74 can be integrally attached to the connector 18 and define a fixed acute angle, $\theta_a$. In some cases, cable 20, 22 can directly protrude from the board side connector 18 at the acute angle, $\theta_a$.

When multiple connectors 72 are arranged along a vertical column, as illustrated in FIG. 5, there can be limited vertical spacing between adjacent vertically arranged connectors 72. The protrusion of the flexible cabling from board side connector 18 at an acute angle, $\theta_a$, as discussed above, can prevent the flexible cabling from coming in contact with the upper vertically adjacent connector 72 by providing additional clearance between the cabling and the board 70. In addition, the resulting increase in clearance can promote easier installation of the board side connector 18 into the connector 72.

Returning to FIG. 2A, flexible cabling between the component side connector 16 and the board side connector 18 can include one or more shielded cables 20 and the flat cable 22. In the cabling configuration shown for data connector 12, the shielded cables 20 are individually covered with an insulative sheath and function as data cabling that carries data signals between the controller board 70 (FIG. 4) and the computer component. Additionally, the flat cable 22 can be a highly flexible power cabling having a separate insulative sheath from the shielded cables 20 and carries power between the controller board 70 (FIG. 4) and the computer component.

Figure 6:
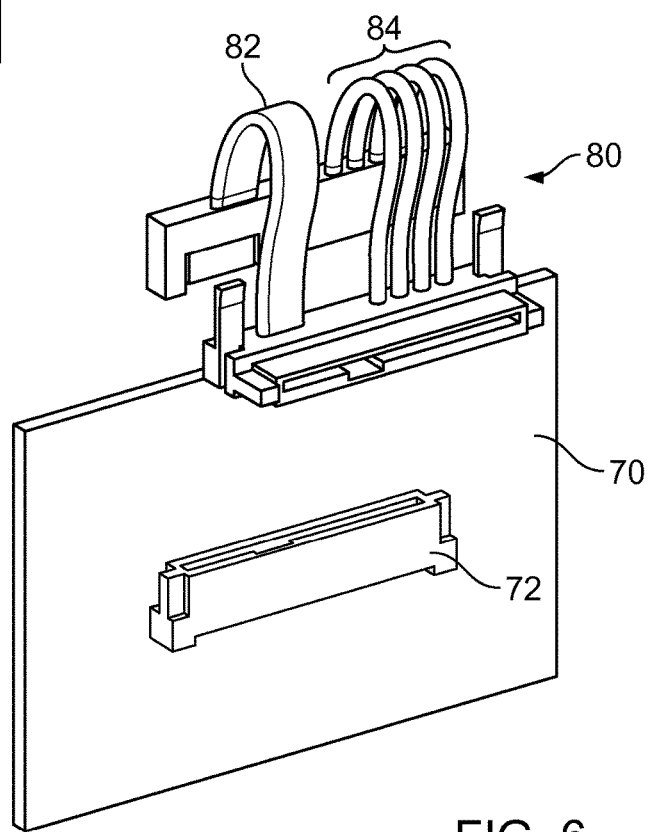
FIG. 6 is a perspective view of another implementation of a data connector.

In an alternative implementation of the data connector 12 shown in FIG. 6, a data connector 80 includes a single shielded cable 82. The shielded cable 82 can be used for carrying data signals. Additionally, flexible cables 84 can include multiple wires, having separate individual insulative sheaths, that are spaced apart along an axis parallel to the axis Y (FIG. 1B). Other types of flexible cabling for carrying data and/or power signals can be used as desired or necessitated by system requirements.

In addition to providing necessary data and/or power connections between the component side connector 16 and the board side connector 18, the one or more flexible cables of the data connector 12 can be designed and configured to minimally affect the frequency response of the carrier 14. For example, the carrier 14 can be supported by a vibration isolation system designed to isolate the computer component mounted within the carrier 14 from certain frequencies, for example, frequencies above 40 Hz. In such a system, it may be desirable for the cabling to minimally alter the rotational frequency response of the mounted computer component, e.g., the HDD, to the carrier 14, for example, by less than 5 Hz. To reduce the effects of the cabling, which physically connects the controller board to the computer component and can thus increase stiffness, on the frequency response of the vibration isolation system, data/power cabling should be made as flexible as possible. As such, and as discussed above, the flexible flat cable 22 (FIG. 2A), which can be highly flexible in confined space, may be used to achieve the frequency requirements of the system. Alternatively, or additionally, using a cable having a longer length can minimize the effects on the system's frequency response. In some cases, using a highly stranded cable may achieve the desired flexibility.

The floating connection established between the component side connector 16 of the data connector 12 and the carrier 14, as discussed above with respect to FIGS. 1A and 1B, can further help minimize the cabling from affecting the frequency response of the computer component mounted within the carrier 14. For example, because the component side connector 16 is movably coupled to the carrier 14, the transfer of energy between the carrier 14 and the controller board 70 (FIG. 4) is reduced in comparison to a more solid, non-movable connection between the two structures.

Referring again to FIGS. 2A and 2B, the plurality of pins 54, 56 of the component side connector 16 and the board side connector 18 can connect, respectively, to the computer component and the controller board to carry various data and power signals therebetween. In some implementations, one or more pins of the plurality of pins 54, 56 can be designated for detecting whether the computer component, such as the hard disk drive, has been inserted into the carrier 14. For example, two of multiple conducting lines within the flexible flat cable 22, and their respectively connected pins, can be used to detect whether the HDD has been connected to the component side connector 16.

More specifically, as a non-limiting example, the controller board 70 (FIG. 4) can apply power to a first pin while not applying power to a second pin. When the HDD is not present, the second pin will indicate a low signal as no power has been applied to the second pin. However, when the HDD is properly inserted into the carrier 14 and successfully mated to the component side connector 16, the HDD will short the first and second pins at the component side such that the signal on the second pin will shift from low to high. Sensing this signal shift in the second pin, for example via a processor connected to the controller board, will indicate that the hard drive disk has been properly inserted into the carrier 14. Such a detection scheme can be especially useful, for example, in blind mating applications where a visual confirmation of successful mating may be difficult.

A number of implementations have been described. Nevertheless, it will be understood that various modifications may be made. For example, the alignment features 52 can include magnetically coupling elements. As another example, data and/or power signals communicated between the controller board and the computer component can include optical and other non-electrical signals. In some implementations, a portion of the component side connector 16 can project into a guide slot disposed on the back plate.

In some implementations, a projection of the back plate can project into a notch disposed on the component side connector 16. Accordingly, other implementations are within the scope of the following claims.

What is claimed is:

1. A method for detecting that a hard disk drive is inserted into a carrier, comprising: supporting a first connector of a data connector on the carrier, the first connector configured to mate to a plurality of pins of the hard disk drive; applying power to a first pin of the first connector; and sensing that a signal on a second pin of the first connector shifts from low to high when power is applied to the first pin; and further sensing that the signal on the second pin stays at low when power is applied to the first pin of the first connector; and determining, based on the sensed low signal, that a successful connection has not been made between the first connector and the hard disk drive.

2. The method of claim 1, further comprising designating the first and second pins, out of the plurality of pins, to apply and sense power, respectively.

3. The method of claim 2, wherein the first and second pins are connected through respective conducting lines of a flexible cable.

4. The method of claim 1, further comprising not applying power to the second pin when applying power to the first pin.

5. The method of claim 1, further comprising determining, based on the sensed high signal on the second pin, that a successful connection has been made between the first connector and the hard disk drive.

6. The method of claim 5, further comprising providing visual indication of the successful connection through a controller board coupled with the hard disk drive.

7. The method of claim 1, further comprising:
shorting the first and second pins; and
based on the shorted first and second pins, shifting the signal from low to high.

8. A hard disk drive detection apparatus, comprising: a computer component assembly comprising a hard disk drive; a carrier that couples the hard disk drive to a board controller, the carrier comprising a data connector that comprises a first connector configured to mate to a plurality of pins of the hard disk drive, the board controller comprising a processor that is operable to execute instructions stored on the board controller to perform operations comprising: applying power to a first pin of the first connector; and sensing that a signal on a second pin of the first connector shifts from low to high when power is applied to the first pin; and wherein the operations further include sensing that the signal on the second pin stays at low when power is applied to the first pin of the first connector; and determining, based on the sensed low signal, that a successful connection has not been made between the first connector and the hard disk drive.

9. The hard disk drive detection apparatus of claim 8, wherein the operations further comprise:
designating the first and second pins, out of the plurality of pins, to apply and sense power, respectively.

10. The hard disk drive detection apparatus of claim 9, wherein the first and second pins are connected through respective conducting lines of a flexible cable.

11. The hard disk drive detection apparatus of claim 8, wherein the operations further comprise:
not applying power to the second pin when applying power to the first pin.

12. The hard disk drive detection apparatus of claim 8, wherein the operations further comprise:
determining, based on the sensed high signal on the second pin, that a successful connection has been made between the first connector and the hard disk drive.

13. The hard disk drive detection apparatus of claim 12, wherein the operations further comprise:
providing visual indication of the successful connection through a controller board coupled with the hard disk drive.

14. The hard disk drive detection apparatus of claim 8, wherein the operations further comprise:
shorting the first and second pins; and
based on the shorted first and second pins, shifting the signal from low to high.

* * * * *